United States Patent Office 3,547,716

Patented Dec. 15, 1970

3,547,716

ISOLATION IN EPITAXIALLY GROWN MONOLITHIC DEVICES

David DeWitt, Poughkeepsie, Harlan R. Gates, Wappingers Falls, and Alan Platt, La Grangeville, N.Y., assignors to International Business Machines Corporation, Armonk, N.Y., a corporation of New York Filed Sept. 5, 1968, Ser. No. 757,533
Int. Cl. H01l 7/36
U.S. Cl. 148—175 9 Claims

ABSTRACT OF THE DISCLOSURE

A technique for producing a monolithic semiconductor structure having device isolation, according to which isolation moats or channels are formed in the monolith so as completely to surround each of the individual device "islands." These channels are isolating by virtue of the fact that they define PN junctions with the device islands and with the remainder of the substrate. The channels are simply formed by discrete diffusions into the monolith so that separately formed regions merge together to produce the desired channels.

BACKGROUND, SUMMARY AND OBJECTS OF THE INVENTION

Figure 1:
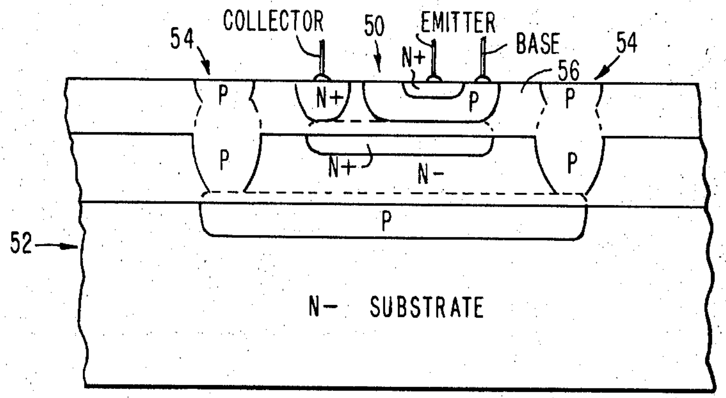

This invention relates to semiconductor device and circuit manufacture, and more particularly, to a branch thereof known as integrated circuit manufacture. The invention is more particularly concerned with techniques of fabricating monolithic integrated circuits so as to provide isolation between the devices incorporated in the monolith.

The term "integrated circuits" encompass a variety of techniques and forms in the field of micro-miniaturization or micro-circuitry. These forms have in general evolved in response to demands that entire circuit configurations of fairly complex character be miniaturized. Several decades ago it was printed circuits, and like techniques, that aided in achieving reasonably high packing densities in the formation of circuits. Now the demand for the ultimate in miniaturization is so great that only the so-called integrated circuit approaches will satisfy the extreme packing density requirements. For example, in modern day circuitry as many as 1,000 devices are packed together in an area of .01 square inch.

Some of the approaches to device and circuit fabrication that have been lumped under a heading of "integrated," are those in which, for example, the devices themselves are produced quite conventionally by sequential diffusion steps involving the diffusion of several desired impurity materials into a semiconductor wafer, followed by the dicing or cutting up of the semiconductor wafer into single or multiple device "chips." These "chips" are then mounted and secured to a circuit board or ceramic module and are connected together in complex arrays by known printed circuit or other techniques.

Devices fabricated in accordance with the above-described first approach afford excellent electrical isolation but unfortunately their packing density is rather limited, and furthermore, they involve interconnections which are difficult to apply and frequently turn out to be the source of mechanical and electrical difficulties.

The other general approach, noted above, is regarded as a more advanced form of integrated circuitry and has been referred to as the monolithic form. Such an approach envisions the embodying of great numbers of individual elements, which may comprise transistors, diodes, or other active or passive devices, or even cross-overs and the like. As a result of the monolithic technique all of the elements are susceptible to being left in place within the monolith and of being judiciously interconnected by means of leads arranged on the top surface of the monolith.

However, due to the fact that all of the devices are contained within a common block or monolith of semiconductor material, they form a single physical unit and therefore they introduce problems of electrical isolation. One way of attempting to electrically isolate the elements is by interposing one or more PN junctions between the elements in the monolith. It has been found, however, that for high speed operation this PN junction interposition technique suffers from the disadvantage of unwanted parasitic electrical effects as a result of inadequate isolation between individual elements. Also, PN junctions have high leakage currents associated with them. by comparison with other insulation techniques. Moreover, the capacitances associated with PN junctions tend to cause undesired coupling between devices and to ground. A further potential difficulty is that PNPN or NPNP action can occur under the right set of conditions.

Because of the relatively poor results obtainable with the PN junction solution to the isolation problem, efforts have been directed to obtaining dielectric isolation in monolithic integrated circuits. For an appreciation of the dielectric solution to the problem of isolation in integrated circuits, reference may be made to an article "The Minimization of Parasitics in Integrated Circuits by Dielectric Isolation," Maxwell et al., Transactions of IEEE on Electron Devices, January 1965, pp. 20–24. That article makes clear the desirability of providing thin isolating channels of dielectric material, for example, of silicon oxide, to surround the device islands, rather than utilizing a substratum entirely made of dielectric because in the latter case the thermal conductance of the dielectric is not nearly so good as the conductance of a semiconductor substratum.

Despite the advantages noted above for the dielectric isolation arrangement, there are many difficulties which attend such a technique. There are, for example, problems of dimensional control, particularly as those relating to the size of the device "islands." Also, since the technique involves lapping of the original substratum there is a problem of work damage. Furthermore, very many process steps are required to effect the desired results.

Accordingly, it is a primary object of the present invention to provide a superior isolation technique for isolating the multitude of devices formed in a semiconductor monolith.

Another object is to produce an isolation channel constituted solely of semiconductor material and entirely surrounding each of the devices within the monolith.

Another object is to achieve isolation by means of PN junctions but to do so without the restrictions and difficulties normally encountered in such attempts at isolation.

Another object of this invention is a semiconductor monolith for integrated circuit fabrication which has an extremely high degree of electrical isolation between elements but without requiring in the process completely separate isolation-diffusion times. In other words, at least some of the diffusion that is aimed at producing the isolation channels is performed concurrently with the diffusion whose objective is to produce device regions.

Broadly, considered, then, the present invention involves a method and a monolithic semiconductor structure produced by the method, whereby an isolating channel is formed to surround each of the active devices in the monolith, the semiconductor isolation channel being reproduced by a unique combination of deposition and diffusion steps so as to produce a practicable structure.

In a specific form of the present invention there is provided a method whereby the following steps are per-

ISOLATION IN EPITAXIALLY GROWN MONOLITHIC DEVICES

Filed Sept. 5, 1968

INVENTORS
DAVID DE WITT
HARLAN R. GATES
ALAN PLATT

BY John F. Ohlandt Jr.
ATTORNEY form the 0.5 micron layer of silicon dioxide which serves as the diffusion mask. The region 20 of N+ conductivity is thereby produced and this region constitutes the so-called sub-collector. As before, such diffusion is performed in an evacuated sealed vessel by exposure to the vapors of a powdered silicon source doped to the desired $C_0$ at a temperature of 1100° C. for 30 minutes. Typical parameters are: $C_0=10^{21}$ atoms/cm.$^3$, $\rho s=9r/\square$, $X_j=0.7$ micron.

Figure 2A:
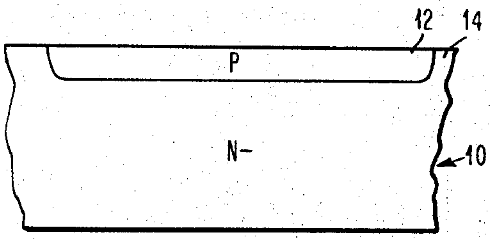
Figure 2B:
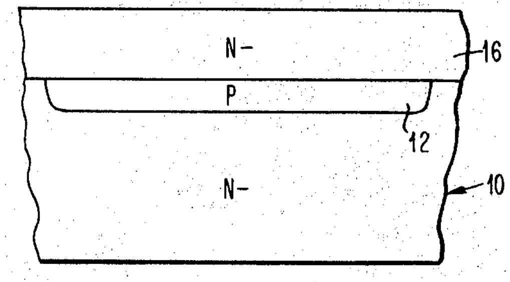
Figure 2C:
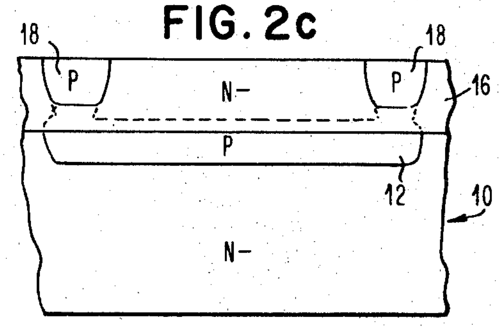
Figure 2D:
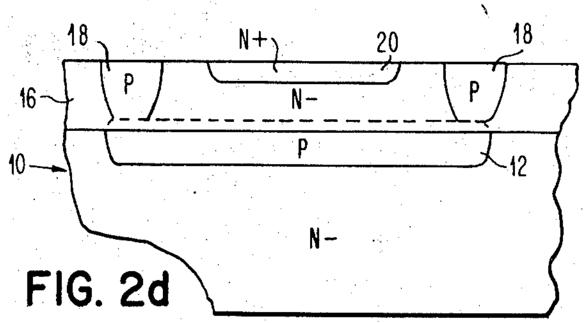
Figure 2E:
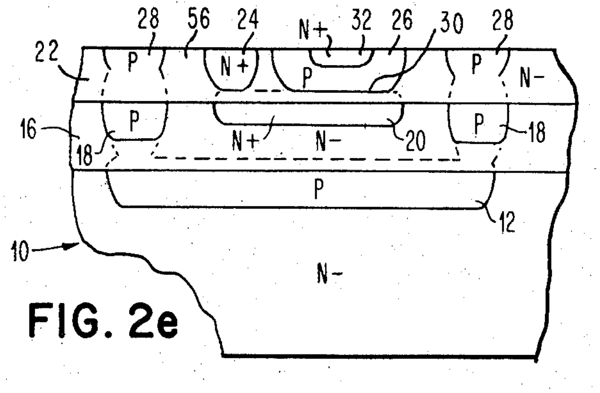

Thereafter, another epitaxial layer designated 22 is grown on the upper surface of the structure. This second epitaxial layer is seen in FIG. 2*e* and is of N− conductivity, being doped to the order of $10^{15}$ atoms/cm.$^3$. The technique for growing the layer 22 is the same as that described for the epitaxial growth of layer 16. Into the layer 22 the final region is diffused for the purpose of completing the isolation channel for the given device, and further regions are produced for completing the device itself. Here, again, by suitable masking the N+ region 24 is produced and this region extends in depth so as to link with or reach through, to the N+ sub-collector region 20. More precisely, due to out-diffusion of impurities from the region 20 formed in the first epitaxial layer 16 into the second epitaxial layer 22, there is merging of the region 24 with region 20.

The creation of the region 24 is preferably achieved by the diffusion in an open tube reaction apparatus of $POCl_3$ at a temperature of 970° C. for 30 minutes, followed by a 60-minute, dry $O_2$ oxidizing step at 1050° C. to effect contact to region 20.

A further diffusion step is performed similar to those already described according to which both the base region 26 and the region 28 are formed. The parameters are so selected that the base region meets the aforedescribed sub-collector out-diffusion. That is to say, the base region 26 meets with the diffusion front from region 20 and defines the collector-base junction 30. A useful set of parameters is as follows:

$C_0 \sim 5\times10^{19}$ atoms/cm.$^3$, $X_j \sim 1$ micron.
$T=1075°$ C.
$t=75$ minutes.

An oxidation step, as before, is used in order to drive in the impurities to the desired final base junction depth of approximately two microns and a surface concentration of approximately $1\times10^{19}$ atoms/cm.$^3$. This oxidation treatment is performed with the temperature, $T=1150°$ C. Such treatment results in a $SiO_2$ thickness of approximately 4000 A. at the surface of the substrate.

As has been noted before, the collector series resistance is substantially reduced because of this particular configuration and because of the high doping level involved in the collector formation. Moreover, the collector capacitance is kept to a minimum because of the reduced area of the base-collector junction 30 as that is formed.

The final step in the completion of the transistor device 50 is the formation of the emitter region 32 by another diffusion operation. This region is chosen to be of high conductivity and of N conductivity type or, in other words, N+. The formation of the emitter region 32 is preferably achieved by the diffusion of $POCl_3$ at a temperature of 970° C. for 30 minutes to produce a surface concentration of $10^{21}$ atoms/cm.$^3$ and a junction depth of approximately one micron. A subsequent oxidizing drive-in diffusion step performed at 970° C. results in a final junction depth of approximately 1.5 microns.

It should be particularly noted that the formation of the region 28 is such that the total out-diffusion from the region 18 will allow for completion of the isolation channel desired. Thus, the region 28 is merged with the region 18 for this purpose.

Figure 3:
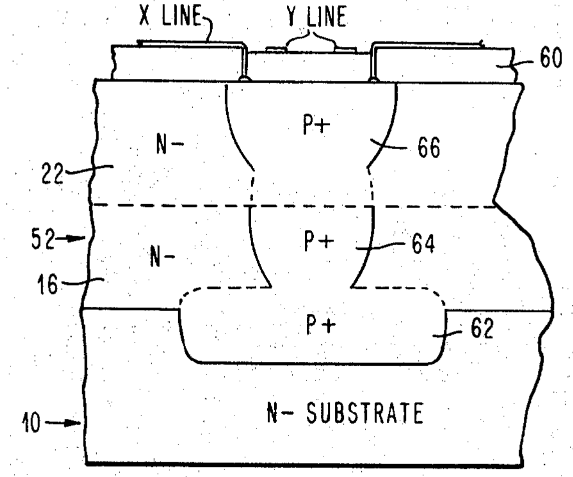

Referring now to FIG. 3, there will be explained an alternative embodiment, that is, a modification of the already described technique applied to the formation of a so-called "underpass." Here the objective is to provide an underpass of very low resistance. The function of the underpass is simply to allow an arbitrarily chosen X line, to pass under the Y lines in a facile manner. These Y lines are shown in orthogonal relationship with the X line and all of them typically illustrated as overlying a glass or oxide layer 60. Some of the same reference numerals are shown in FIG. 3 because the same essential parts as those already described are involved. Thus, the N-substrate 10 and the epitaxial layers 16 and 22 are the same as shown previously.

The three regions which constitute the underpass are analogous to the diffused regions of the embodiment of FIGS. 1 and 2, that is, to the regions 12, 18, and 28. The analogous regions are here designated 62, 64, and 66 respectively, these regions being formed by a sequence of diffusion steps through suitable openings in a masking layer. As before, due to appropriate selection of parameters, the three regions are merged together and effectively are in parallel, thereby to serve as a very low resistance underpass.

What has been disclosed herein is a novel technique, and a monolithic semiconductor structure produced thereby, according to which an isolating channel or semiconductor material completely surrounds each of the individual device islands These channels are effective to define PN junctions with the device islands and also with the bulk of the substrate. As a result, much more effective isolation than that heretofore obtained is realized. In accordance with the technique, at least some of the diffusion that is aimed at producing the isolation channels is performed concurrently with the diffusion whose objective is to produce device regions.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A process of fabricating a monolithic semiconductor structure so as to isolate discrete elements within the monolith comprising the steps of:

(a) providing a substrate of semiconductor material of given conductivity type; and, at a plurality of device sites on a surface of the substrate;

(b) forming within the substrate a layer of conductivity type opposite to that of the substrate;

(c) growing a first epitaxial layer of semiconductor material over said first formed layer, said epitaxial layer being of the same conductivity type as the substrate;

(d) after growing said first epitaxial layer, forming by diffusion a region of opposite conductivity type which extends substantially through said first epitaxial layer in order to reach said first formed layer at the periphery thereof;

(e) growing a second epitaxial layer over the first epitaxial layer;

(f) after growing said second epitaxial layer, forming by diffusion another region of opposite conductivity type which extends in depth through said second epitaxial layer to merge with the first region, the first formed layer and the two regions together defining an isolation channel surrounding a device island in said monolith.

2. A process as defined in claim 1, in which said substrate is constituted of silicon.

3. A process as defined in claim 1, in which steps (b), (d), and (f) include introducing impurities into the monolith by solid state diffusion.

4. A process as defined in claim 1, further including the step of forming at least one junction within said device island.

5. A process as defined in claim 1, including the step of forming emitter and collector junctions within said device island.

6. A process as defined in claim 5, including the step of producing the collector junction by initially diffusing impurities into said first epitaxial layer and then by diffusing impurities of said opposite conductivity type into said second epitaxial layer.

7. A process as defined in claim 6, further including the step of contacting the collector region by forming a region which extends from the surface of the second epitaxial layer to a depth sufficient to reach said collector region.

8. A process as defined in claim 1, in which said substrate and said first and second epitaxial layers are of N-conductivity.

9. A process as defined in claim 1, further including the steps of forming collector base and emitter regions for a transistor device within said device island, and wherein the step of forming the base region is performed concurrently with step (f).

References Cited

UNITED STATES PATENTS

| | | | |
|---|---|---|---|
| 3,260,902 | 7/1966 | Porter | 317—235 |
| 3,312,882 | 4/1967 | Pollock | 317—235 |
| 3,327,182 | 6/1967 | Kisinko | 317—235 |
| 3,335,341 | 8/1967 | Lin | 317—235 |
| 3,341,755 | 9/1967 | Husher et al. | 317—235 |
| 3,370,995 | 2/1968 | Lowery et al. | 148—175 |
| 3,379,584 | 4/1968 | Bean et al. | 148—175 |

JOHN W. HUCKERT, Primary Examiner

M. H. EDLOW, Assistant Examiner

U.S. Cl. X.R.

148—186; 317—235